US011604216B2

(12) United States Patent
Yang et al.

(10) Patent No.: US 11,604,216 B2
(45) Date of Patent: Mar. 14, 2023

(54) VOLTAGE DETECTION CIRCUIT, POWER SUPPLY SYSTEM AND CHIP

(71) Applicant: Wuxi Chipown Microelectronics Co., Ltd., Jiangsu (CN)

(72) Inventors: Fan Yang, Jiangsu (CN); Xiaokang Wei, Jiangsu (CN); Haisong Li, Jiangsu (CN); Yangbo Yi, Jiangsu (CN)

(73) Assignee: Wuxi Chipown Microelectronics Co., Ltd., Wuxi (CN)

( * ) Notice: Subject to any disclaimer, the term of this patent is extended or adjusted under 35 U.S.C. 154(b) by 32 days.

(21) Appl. No.: 17/410,693

(22) Filed: Aug. 24, 2021

(65) Prior Publication Data

US 2022/0413019 A1    Dec. 29, 2022

(30) Foreign Application Priority Data

Jun. 25, 2021   (CN) .................. 202110714864.X

(51) Int. Cl.
*G01R 19/00*    (2006.01)
*H02M 3/04*    (2006.01)

(52) U.S. Cl.
CPC ........... *G01R 19/0084* (2013.01); *H02M 3/04* (2013.01)

(58) Field of Classification Search
CPC ............... G01R 19/00; G01R 19/0084; G01R 19/0092; H02M 3/00; H02M 3/02; H02M 3/04
USPC .... 324/76.11, 500, 522, 600, 649, 691, 713; 702/1, 57, 64
See application file for complete search history.

(56) References Cited

U.S. PATENT DOCUMENTS

| | | | | |
|---|---|---|---|---|
| 5,710,778 A * | 1/1998 | Bettman | ................ | G11C 29/02 714/721 |
| 8,476,865 B2 * | 7/2013 | Iwanaga | ................. | B60L 53/14 320/132 |
| 2006/0017494 A1 * | 1/2006 | Horiguchi | .............. | G11C 5/147 327/538 |
| 2011/0057611 A1 * | 3/2011 | Nakaso | ................. | B60W 20/15 320/109 |
| 2014/0372050 A1 * | 12/2014 | Kanda | .................... | G01R 31/64 702/57 |

* cited by examiner

*Primary Examiner* — Hoai-An D. Nguyen
(74) *Attorney, Agent, or Firm* — Harness, Dickey & Pierce, P.L.C.

(57) ABSTRACT

A voltage detection circuit, a power supply system and a chip are provided. The voltage detection circuit includes: a first step-down sub-circuit, a second step-down sub-circuit and a first voltage-stabilizing sub-circuit; wherein the first step-down sub-circuit has one end connected to one end of the second step-down sub-circuit in series; the first step-down sub-circuit has another end connected to a first port of the voltage detection circuit; and the second step-down sub-circuit has another end connected to a second port of the voltage detection circuit; and wherein the first voltage-stabilizing sub-circuit has one end connected to a third port of the voltage detection circuit and has another end connected to the second port, where the first voltage-stabilizing sub-circuit is turned on when the third port has a voltage higher than the second port and stabilized when the third port has a voltage lower than the second port.

20 Claims, 6 Drawing Sheets

VOLTAGE DETECTION CIRCUIT, POWER SUPPLY SYSTEM AND CHIP

CROSS-REFERENCE TO RELATED APPLICATIONS

This application claims the benefit of priority to Chinese Patent Application No. 202110714864.X, filed on Jun. 25, 2021, and entitled "VOLTAGE DETECTION CIRDUIT, POWER SUPPLY SYSTEM AND CHIP", the entire disclosure of which is incorporated herein by reference.

TECHNICAL FIELD

The present disclosure generally relates to electronic circuits technology field, and more particularly, to a voltage detection circuit, a power supply system and a chip.

BACKGROUND

With the continuous development of electronic power technology and industrial manufacturing technology, various household appliances are designed to have more and more functions and to be operated more conveniently, which makes internal hardware structures of the household appliances become more and more complicated. In the household appliances, it is usually necessary to detect the input voltage of the mains power supply for timing or hardware protection. In this case, the input voltage detection technology is particularly important.

However, in existing techniques, a voltage detection circuit usually has a complicated structure, which is difficult to be integrated on a chip.

SUMMARY

Embodiments of the present disclosure provide a solution on how to simplify a structure of a voltage detection circuit.

In an embodiment of the present disclosure, a voltage detection circuit is provided, including: a first step-down sub-circuit, a second step-down sub-circuit and a first voltage-stabilizing sub-circuit; wherein one end of the first step-down sub-circuit is connected to one end of the second step-down sub-circuit, and the first step-down sub-circuit and the second step-down sub-circuit are connected in series; another end of the first step-down sub-circuit is connected to a first port of the voltage detection circuit; and another end of the second step-down sub-circuit is connected to a second port of the voltage detection circuit; wherein the first voltage-stabilizing sub-circuit has one end connected to a third port of the voltage detection circuit and has another end connected to the second port of the voltage detection circuit, where the first voltage-stabilizing sub-circuit is adapted to be turned on when a voltage of the third port is higher than a voltage of the second port and to be stabilized when the voltage of the third port is lower than the voltage of the second port; and wherein when the first step-down sub-circuit steps down an input voltage, the second step-down sub-circuit is in a short-circuit state; and when the second step-down sub-circuit steps down the input voltage, the first step-down sub-circuit is in a short-circuit state.

In an embodiment of the present disclosure, a power supply system which includes the voltage detection circuit described above is provided.

In an embodiment of the present disclosure, a chip which has the above voltage detection circuit integrated therein is provided.

Embodiments of the present disclosure may have following advantages.

In embodiments of the present disclosure, when the first step-down sub-circuit steps down a voltage of the first port, the second step-down sub-circuit is in a short-circuit state, and the first voltage-stabilizing sub-circuit presents a voltage stabilizing state, so that the second port outputs a high-level signal; when the second step-down sub-circuit steps down a voltage of the third port, the first step-down sub-circuit is in a short-circuit state, and the first voltage-stabilizing sub-circuit is turned on, so that the second port outputs a low-level signal. According to the embodiments, the voltage detection circuit can perform tracking and detection of an input voltage accurately and timely. Compared with the prior art, the voltage detection circuit which includes the first step-down sub-circuit, the second step-down sub-circuit and the first voltage-stabilizing sub-circuit has a simpler structure, which is much easier to be integrated on a chip.

DETAILED DESCRIPTION

In existing techniques, a voltage detection circuit usually includes a current-limiting resistor, an optocoupler and an output device, which has a lot of components and a complex structure, result in difficulty to be integrated in a chip.

Embodiments of the present disclosure provide a voltage detection circuit. The voltage detection circuit includes a first step-down sub-circuit, a second step-down sub-circuit, and a first voltage-stabilizing sub-circuit. Each sub-circuit may only include some simple components, so that the voltage detection circuit has a smaller number of components and a simple structure, which facilitates to be integrated on a chip.

In order to clarify the object, characteristic and advantages of embodiments of the present disclosure, embodiments of present disclosure will be described clearly in detail in conjunction with accompanying drawings.

Figure 1:
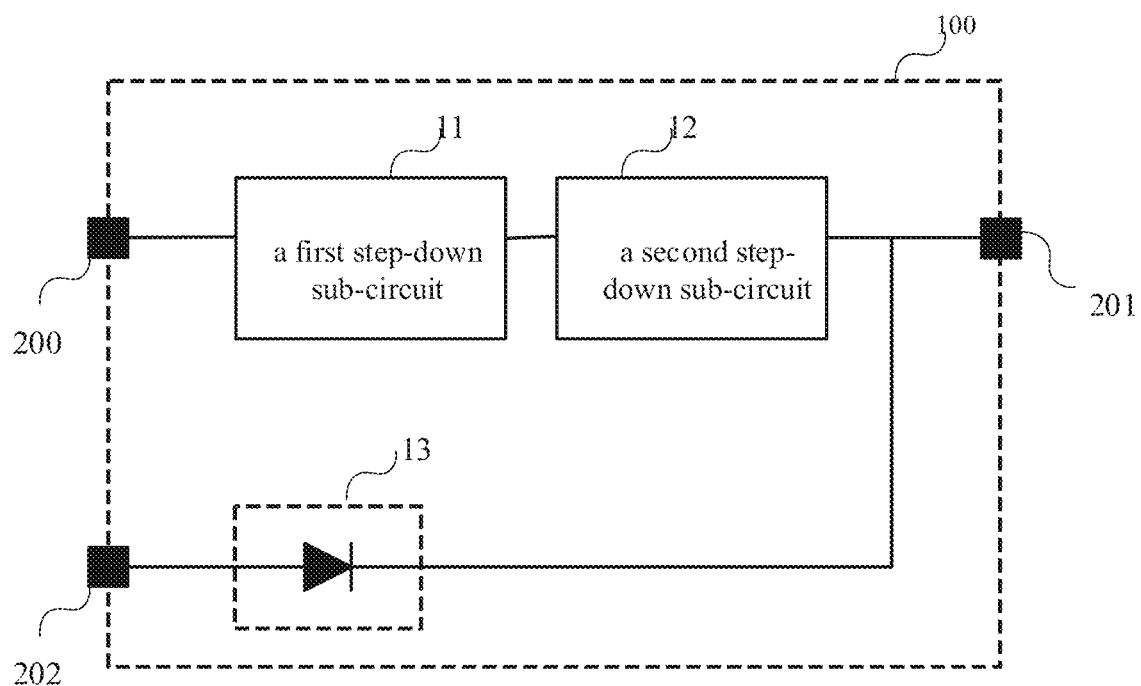
FIG. 1 schematically illustrates a structural diagram of a voltage detection circuit according to an embodiment.

Referring to FIG. 1, in an embodiment of the present disclosure, a voltage detection circuit 100 is provided. The voltage detection circuit 100 includes: a first step-down sub-circuit 11, a second step-down sub-circuit 12 and a first voltage-stabilizing sub-circuit 13.

In an embodiment, one end of the first step-down sub-circuit 11 is connected to one end of the second step-down sub-circuit 12, where the first step-down sub-circuit 11 and the second step-down sub-circuit 12 are connected in series; another end of the first step-down sub-circuit 11 is connected to a first port 200 of the voltage detection circuit; and another end of the second step-down sub-circuit 12 is connected to a second port 201 of the voltage detection circuit.

In the embodiment, the first voltage-stabilizing sub-circuit 13 has one end connected to a third port 202 of the voltage detection circuit and another end connected to the second port 201 of the voltage detection circuit, where the first voltage-stabilizing sub-circuit 13 is turned on when the third port 202 has a voltage higher than the second port 201.

In the embodiment, when the first step-down sub-circuit 11 steps down an input voltage, the second step-down sub-circuit 12 is in a short-circuit state; and when the second step-down sub-circuit 12 steps down the input voltage, the first step-down sub-circuit 11 is in a short-circuit state.

In an embodiment, taking the first port 200 and the third port 202 as voltage input ports as an example, when a voltage of the first port 200 is higher than a voltage of the third port 202, the first step-down sub-circuit 11 is adapted to step down the voltage of the first port 200, the second step-down sub-circuit 12 is in a short-circuit state, and the first voltage-stabilizing sub-circuit 13 is in a voltage stabilizing state, so that the first voltage-stabilizing sub-circuit 13 may stably output a voltage higher than the voltage of the third port 202 from the second port 201.

In the embodiment, when the voltage of the first port 200 is lower than the voltage of the third port 202, the first voltage-stabilizing sub-circuit 13 is turned on, the second step-down sub-circuit 12 is adapted to step down the voltage of the third port 202, and the first step-down sub-circuit 11 is in a short-circuit state, so that the second port 201 may output a voltage lower than the voltage of the third port 202.

In an embodiment, the first voltage-stabilizing sub-circuit 13 may include a third diode which has an anode connected to the third port 202 and a cathode connected to the second port 201.

In an embodiment, the voltage of the third port 202 is usually defined as 0V. Since the first step-down sub-circuit 11 and the second step-down sub-circuit 12 are connected in series, when the voltage of the first port 200 is higher than the voltage of the third port 202, the voltage of the first port 200 is stepped down by the first step-down sub-circuit 11 and stabilized by the first voltage-stabilizing sub-circuit 13, and then is output to the second port 201. In this case, the voltage of the second port 201 is usually greater than 0V, which works as a high-level voltage signal.

When the voltage of the third port 202 is higher than the voltage of the first port 200, the first voltage-stabilizing sub-circuit 13 is turned on, the voltage of the second port 201 is stepped down by the second step-down sub-circuit 12, and the first step-down sub-circuit is in a short-circuit state. In this case, the voltage of the second port 201 is lower than the voltage of the third port 202, which works as a low-level voltage signal.

In summary, according to the embodiments of the present disclosure, the voltage detection circuit may accurately and timely track changes of the voltage of the first port 200 and the voltage of the third port 202, and generate a detection result signal which indicates a relationship of the voltages of the two ports. The voltage detection circuit provided in the embodiments may be applied in a variety of applications, for example, a zero-crossing detection circuit, in which the detection result signal generated by the voltage detection circuit may be used to control a switching device in a power system to switch on or off, thereby protecting the switching device from damage and improving the service life of the switching device.

Compared with existing voltage detection circuits, the first step-down sub-circuit 11 and the second step-down sub-circuit 12 only include some simple devices, which facilitates to simplify the structure of the voltage detection circuit 100 and is beneficial for integration.

Those skilled in the art can understand that the first step-down sub-circuit 11 and the second step-down sub-circuit 12 may be implemented in a variety of ways, which are not limited here. The first step-down sub-circuit 11 may have a structure same as or different from the second step-down sub-circuit 12, which is not limited here.

Figure 2:
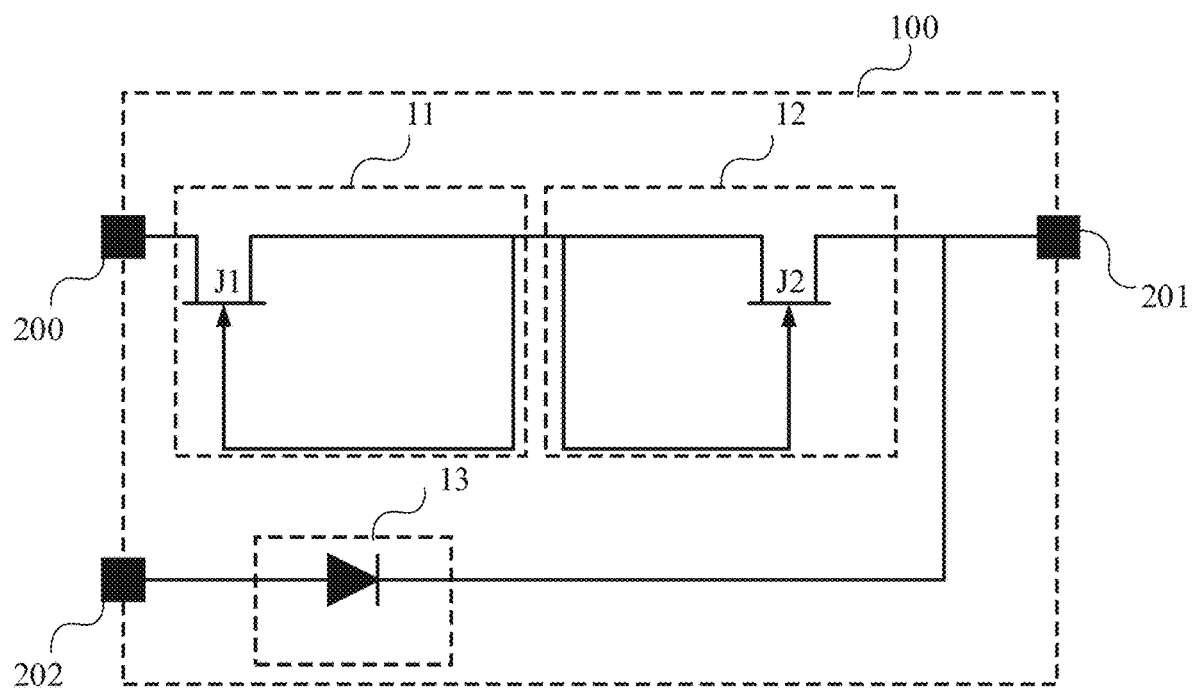
FIG. 2 schematically illustrates a structural diagram of a voltage detection circuit according to another embodiment.

FIG. 2 schematically illustrates a structural diagram of a voltage detection circuit according to another embodiment. Referring to FIG. 2, the first step-down sub-circuit 11 includes a first junction field effect transistor (JFET) J1.

In an embodiment, the first JFET J1 may be an N-channel junction field effect transistor. The first JFET J1 has a drain connected to the first port 200, a source connected to the second step-down sub-circuit 12, and a gate connected to the source of the first JFET J1.

According to principles of an N-channel junction field effect transistor, when a drain of the N-channel junction field effect transistor has a voltage greater than a source of the N-channel junction field effect transistor, the N-channel junction field effect transistor works as a step-down device, which can step down the voltage of the drain. For example, when the voltage of the drain is about 200V, the voltage of the source may be about 15V.

When a voltage of the drain of the N-channel junction field effect transistor is less than a voltage of the source, the N-channel junction field effect transistor works as an equivalent diode and is in a short-circuit state. In this case, the voltage of the drain is close to the voltage of the source and only has a difference caused by the equivalent diode.

In an embodiment, the first JFET J1 is a high voltage JFET, whose specific withstand voltage may be determined according to an application system. For example, when the drain of the first JFET J1 is connected to the mains supply, the withstand voltage of the first JFET J1 is greater than 600V.

In an embodiment, referring to FIG. 2, the second step-down sub-circuit 12 has a same structure as the first step-down sub-circuit 11.

Specifically, the second step-down sub-circuit 12 includes a second JFET J2. The second JFET J2 may also be an N-channel junction field effect transistor, which has a source connected to the first step-down sub-circuit 11, a gate connected to the source of the second JFET J2, and a drain connected to the second port 201.

When the voltage of the first port 200 is higher than the voltage of the third port 202, the voltage of the first port 200 is stepped down by the JFET J1, and the second JFET J2 works as a diode, which makes the voltage of the second port 201 get close to the voltage of the source of the first JFET J1. In this case, the first voltage-stabilizing sub-circuit 13 is in a voltage stabilizing state, and the voltage of the second port 201 is higher than the voltage of the third port 202, which outputs a high-level voltage signal compared to the third port 202.

When the voltage of the third port 202 is higher than the voltage of the first port 200, the first voltage-stabilizing sub-circuit 13 is turned on, and the voltage of the second port 201 is lower than the voltage of the third port 202, so that the second port 201 provides a low-level voltage signal compared to the third port 202. In this case, the second JFET J2 steps down the voltage of the second port 201, and the first JFET J1 works as to a diode. In conjunction with a current-limiting component, an overall power consumption of the voltage detection circuit 100 may be effectively reduced.

Figure 3:
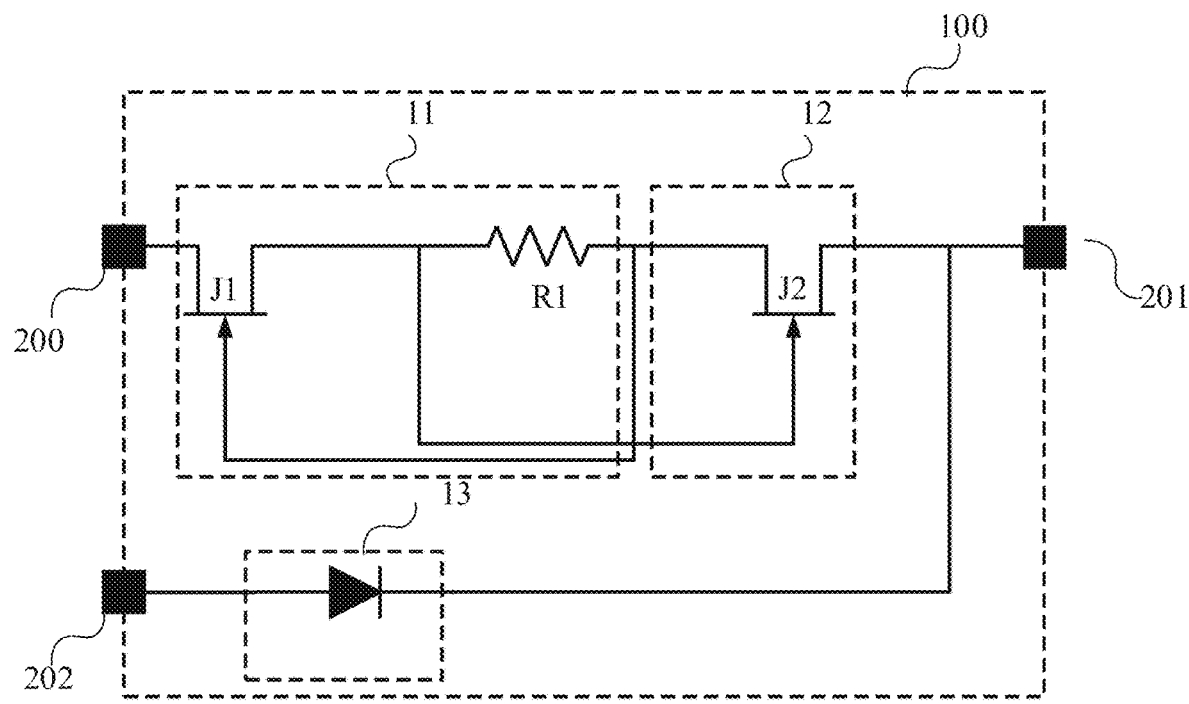
FIG. 3 schematically illustrates a structural diagram of a voltage detection circuit according to another embodiment.
Figure 4:
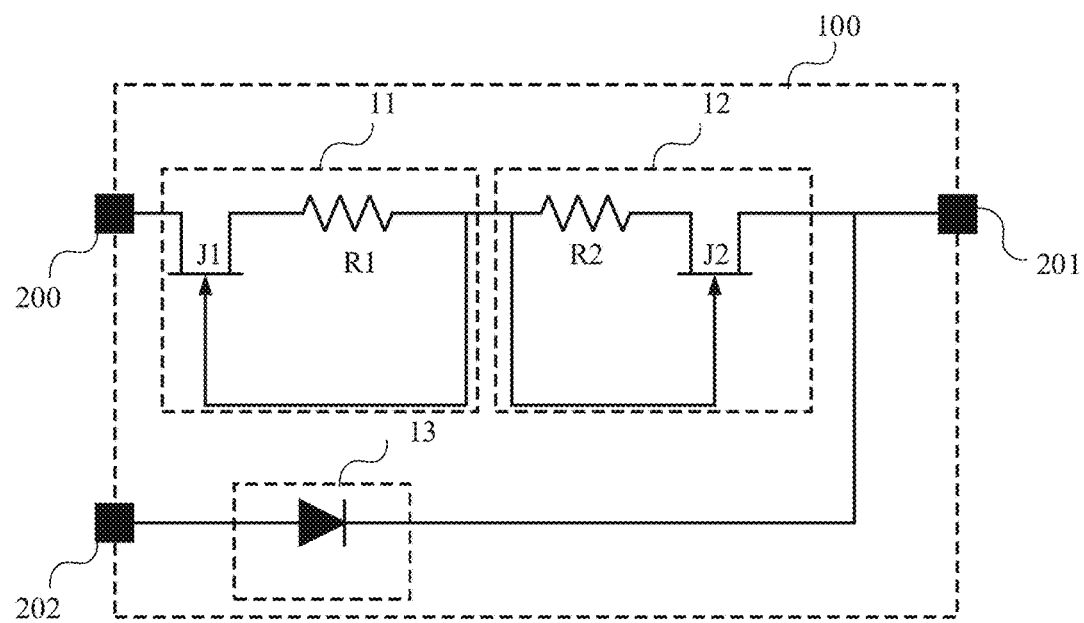
FIG. 4 schematically illustrates a structural diagram of a voltage detection circuit according to another embodiment.
Figure 5:
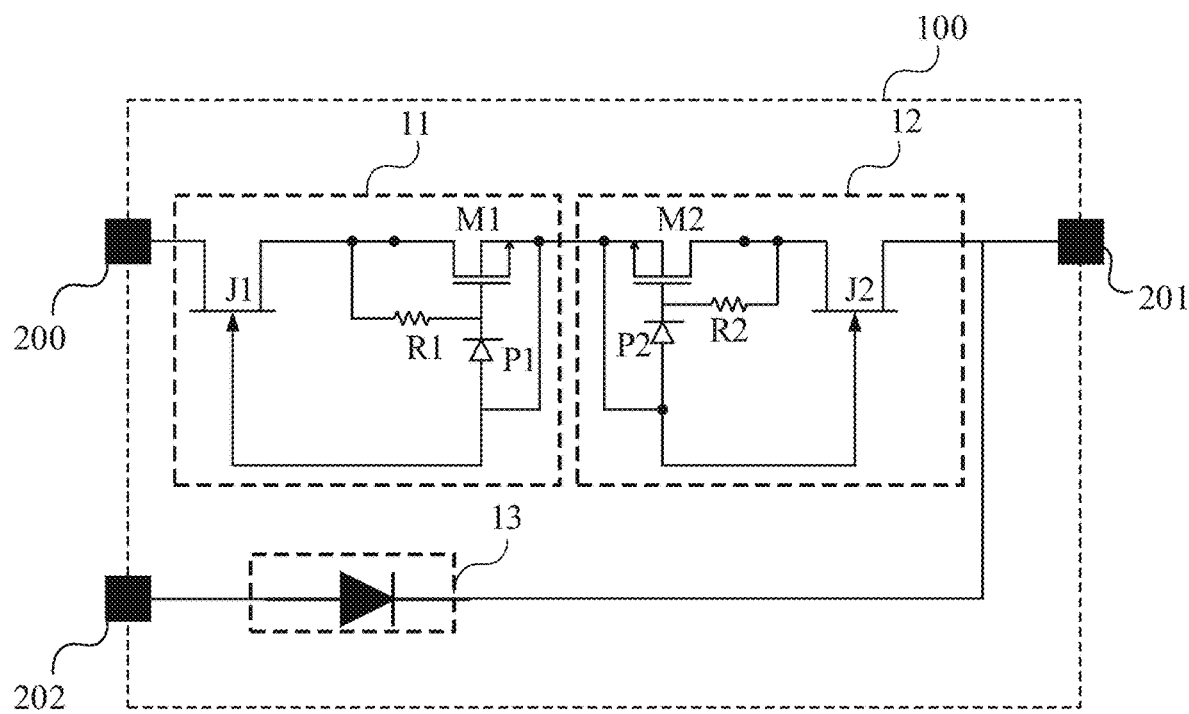
FIG. 5 schematically illustrates a structural diagram of a voltage detection circuit according to another embodiment.

It should be noted that in some embodiments, the second step-down sub-circuit 12 may have a structure different from the first step-down sub-circuit 11. For example, as shown in FIG. 3, 4 or 5, the second step-down circuit has different structures. Principles, detailed implementation and advantages of the second step-down sub-circuit 12 will be described in detail below in conjunction with FIG. 3, 4 or 5.

In an embodiment, the first step-down sub-circuit 11 may further include: a first current limiting component. The first current limiting component has one end connected to the source of the first JFET J1 and another end connected to the second step-down sub-circuit 12. The first current limiting component is configured to control the current flowing through the first step-down sub-circuit 11 and the second step-down sub-circuit 12, which facilitates to reduce the overall power consumption of the voltage detection circuit 100.

In an embodiment, the second step-down sub-circuit 12 may have a same structure as the first step-down sub-circuit 11. Specifically, the second step-down sub-circuit 12 may further include a second current limiting component in addition to the second JFET J2. The second current limiting component has one end connected to the source of the second JFET J2 and another end connected to the first step-down sub-circuit 11.

In some embodiments, the first current limiting component and the second current limiting component may include one or more current-limiting devices, which are not limited here. The current limiting devices may include resistance devices. The first current limiting component may have a structure same as or different form the second current limiting component.

In some embodiments, the first step-down sub-circuit 11 includes the first JFET J1 and does not include the first current limiting component. In this case, the second step-down sub-circuit 12 may only include the second JFET J2, or the second step-down sub-circuit 12 includes the second JFET J2 and the second current limiting component. FIG. 4 or 5 schematically illustrates a structural diagram of the second current limiting component according to an embodiment. In other embodiments, the second current limiting component may include other devices.

In some embodiments, the first step-down sub-circuit 11 includes the first JFET J1 and the first current limiting component. In this case, the second step-down sub-circuit 12 may only include the second JFET J2, or the second step-down sub-circuit 12 includes the second JFET J2 and the second current limiting component. FIG. 3, 4 or 5 schematically illustrates a structural diagram of the first current limiting component according to an embodiment. In other embodiments, the first current limiting component may include other devices.

In an embodiment, referring to FIG. 3, the first current limiting component includes a first resistor R1. The first resistor R1 has one end connected to the source of the first JFET J1 and another end connected to the second step-down sub-circuit 12.

In an embodiment, when the second step-down sub-circuit 12 does not include the second current-limiting component, the first resistor R1 has one end connected to the source of the first JFET J1 and the gate of the second JFET J2. The another end of the first resistor R1 may be connected to the gate of the first JFET J1 and the source of the second JFET J2. In this case, by configuring the first resistor R1, the current between the first port 200 and the third port 202 may be reduced, thereby reducing the overall power consumption of the voltage detection circuit 100.

In another embodiment, when the second step-down sub-circuit 12 includes a second current-limiting component, referring to FIG. 4, the second current-limiting component may be a second resistor R2. One end of the second resistor R2 is connected to the source of the second JFET J2, and another end of the second resistor R2 is connected to the first resistor R1, the gate of the second JFET J2 and the gate of the first JFET J1. Compared with FIG. 3, by configuring the first resistor R1 and the second resistor R2, the current between the first port 200 and the third port 202 can be further reduced, thereby further reducing the overall power consumption of the voltage detection circuit 100.

In another embodiment, referring to FIG. 5, the first current limiting component may include: a first resistor R1, a first diode P1 and a first N-Metal-Oxide-Semiconductor (NMOS) transistor M1. The first resistor R1 has one end connected to the source of the first JFET J1 and a drain of the first NMOS transistor M1, and has another end connected to a gate of the first NMOS transistor M1. The first NMOS transistor M1 is connected to the second step-down sub-circuit 12. The first diode P1 has an anode connected to the gate of the first JFET J1 and a source of the first NMOS tube M1, and has a cathode connected to the gate of the first NMOS transistor M1.

Referring to FIG. 5, the second current limiting component may include: a second resistor R2, a second diode P2 and a second NMOS transistor M2. The second resistor R2 has one end connected to the source of the second JFET J2 and a drain of the second NMOS transistor M2, and has another end connected to a gate of the second NMOS transistor M2. The second diode P2 has an anode connected to the gate of the second JFET J2 and a source of the second NMOS transistor M2, and has a cathode connected to the gate of the second NMOS transistor M2. The second NMOS transistor M2 is connected to the first step-down sub-circuit 11.

Those skilled in the art can understand that, as long as the first current limiting component and the second current limiting component may work to limit the current, the first NMOS transistor M1 may be connected to the second step-down sub-circuit 12 in different ways, and the second NMOS transistor M2 may be connected to the first step-down sub-circuit 11 in different ways, which are not limited here.

For example, referring to FIG. 5, the source of the first NMOS transistor M1 is connected to the source of the second NMOS transistor M2, the anode of the first diode P1 and the anode of the second diode P2. In this case, when the voltage of the first port 200 is higher than the third port 202, the first JFET J1 works as a step-down device, so that a voltage of the gate of the first NMOS transistor M1 is higher than a voltage of the source, the first NMOS transistor M1 is in a conduction state, and the voltage of the gate of the first NMOS transistor M1 is controlled by the first resistor R1 and the first diode P1, thereby effectively controlling a current of the first NMOS transistor M1 which is in the conduction state, which is similar to the first current limiting component shown in FIG. 4. In this case, the second NMOS transistor works as a diode which is turned on.

When the voltage of the first port 200 is lower than the third port 202, the first JFET J1 is in a short-circuit state, a voltage of the gate of the second NMOS transistor M2 is higher than a voltage of the source, and the second NMOS transistor M2 is in a conduction state, and the voltage of the gate of the second NMOS transistor M2 is controlled by the second resistor R2 and the second diode P2, thereby effectively controlling a current of the second NMOS transistor M2 which is in the conduction state, which is similar to the second current limiting component shown in FIG. 4. In this case, the first NMOS transistor M1 works as a diode which is turned on.

Those skilled in the art can understand that, in addition to N-type metal oxide semiconductor field effect transistors, the first NMOS transistor M1 and the second NMOS transistor M2 shown in FIG. 5 may include other field effect transistors, which is not specified here and should not limit the scope of the present disclosure.

In an embodiment, a power supply system is provided, where the power supply system includes the voltage detection circuit 100 in the embodiments described above.

In an embodiment, the power supply system is a non-isolated power supply system, which does not include a device (such as an optocoupler) that separates strong electricity and weak electricity.

In the voltage detection circuit shown in FIGS. 2 and 3, the first port 200 and the third port 202 are voltage input interface. The second port 201 is a voltage output interface. In a non-isolated power supply system, the first port 200 may be connected to one input end of a mains power supply, and the third port 202 may be connected to the other input end of the mains power supply and a ground of the non-isolated power supply system. The second port 201 outputs a voltage detection signal for the two input ends of the mains power supply.

Figure 6:
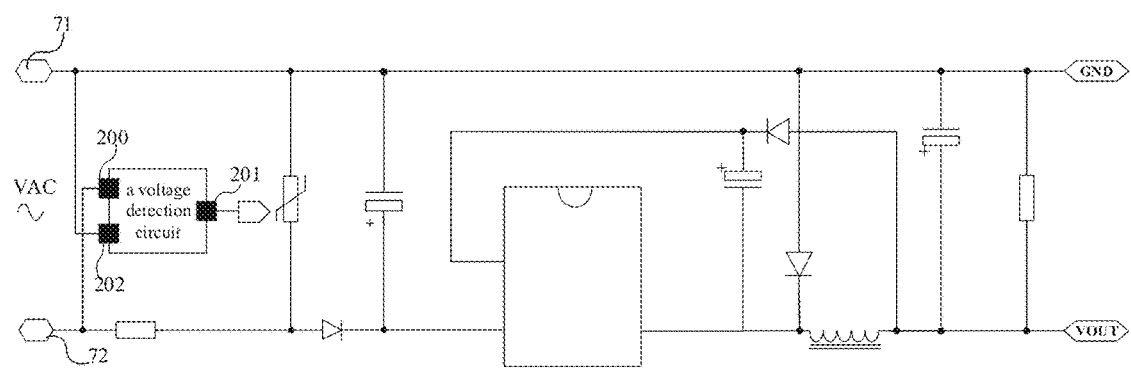
FIG. 6 schematically illustrates a structural diagram of a power supply system according to an embodiment.

In an embodiment, in a buck power supply system shown in FIG. 6, a mains power supply VAC has two input ends, which are a first input end 71 and a second input end 72. The first input end 71 is connected to an output ground of the buck power supply system and the third port 202 of the voltage detection circuit 100. The second input end 72 is connected to the first port 200 of the voltage detection circuit 100. The second port 201 of the voltage detection circuit 100 outputs a voltage detection signal. An output of the buck power supply system may supply power for household appliances.

Figure 7:
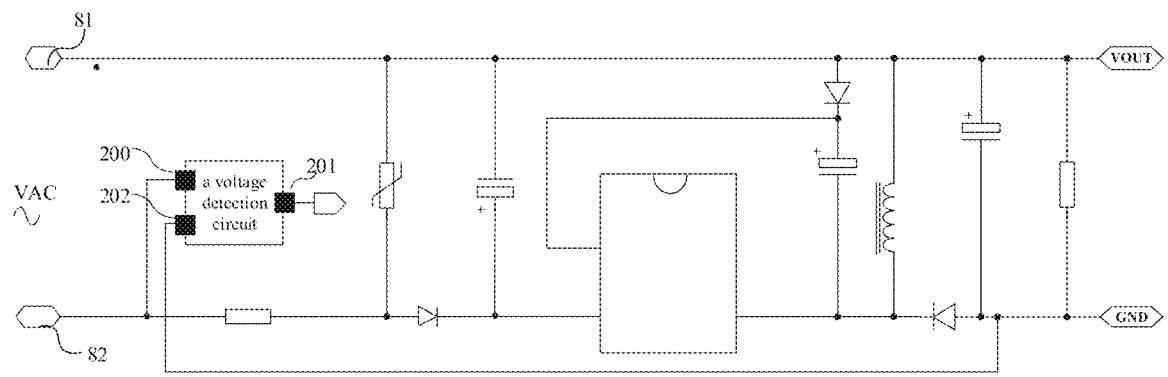
FIG. 7 schematically illustrates a structural diagram of a power supply system according to another embodiment.

In another embodiment, in a buck-boost power supply system shown in FIG. 7, a mains power supply VAC has two input ends, which are a first input end 81 and a second input end 82, where the first input end 81 is connected to an output end VOUT of the buck-boost power supply system, and the second input end 82 is connected to the first port 200 of the voltage detection circuit 100. The third port 202 is connected to an output ground of the buck-boost power supply system. The second port 201 of the voltage detection circuit 100 outputs a voltage detection signal. An output end of the buck-boost power supply system may supply power for household appliances.

Figure 8:
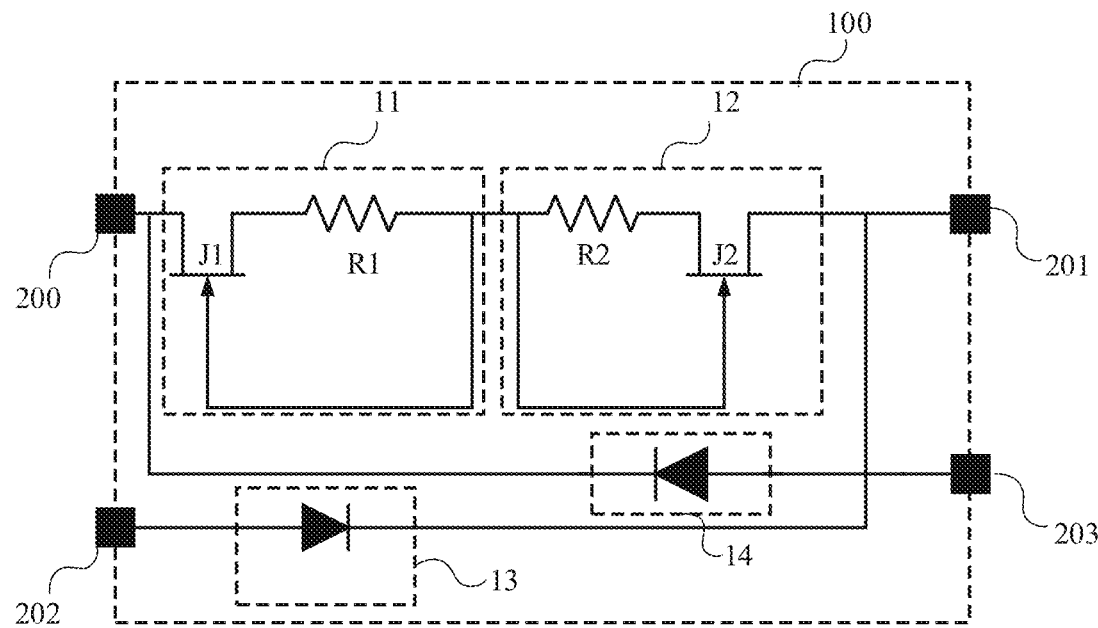
FIG. 8 schematically illustrates a structural diagram of a voltage detection circuit according to another embodiment.

FIG. 8 schematically illustrates a structural diagram of a voltage detection circuit according to another embodiment. Referring to FIG. 8, in order to facilitate voltage detection, the voltage detection circuit 100 may further include a second voltage-stabilizing sub-circuit 14, where the voltage-stabilizing sub-circuit 14 has one end connected to a fourth port 203 of the voltage detection circuit 100, has another end connected to the first port 200, and is turned on when the fourth port 203 has a voltage higher than the voltage of the first port 200.

By configuring the second voltage-stabilizing sub-circuit 14, the second port 201 and the first port 200 of the voltage detection circuit 100 may be used as voltage output ends or voltage input ends. When the second port 201 and the fourth port 203 of the voltage detection circuit 100 works as voltage input ends, the first port 200 of the voltage detection circuit 100 may be used as an output end of the voltage detection signal. When the first port 200 and the third port 202 works as voltage input ends, the second port 201 may be used as an output end of the voltage detection signal.

In an embodiment, as shown in FIG. 8, the second voltage-stabilizing sub-circuit 14 may include a fourth diode, which has an anode connected to the fourth port 203 and a cathode connected to the first port 200.

In some embodiments, the first step-down sub-circuit 11 may have a structure same with or different from the second step-down sub-circuit 12. The first step-down sub-circuit 11 may or may not include a first current-limiting component. The second step-down sub-circuit 12 may or may not include a second current-limiting component.

When the second port 201 and the fourth port 203 of the voltage detection circuit 100 works as voltage input ends and the voltage of the second port 201 is greater than that of the fourth port 203, the second step-down sub-circuit 12 steps down an input voltage, and the first step-down sub-circuit 11 is in a short-circuit state, so that the first port 200 outputs a high-level signal compared to the fourth port 203.

When the second port 201 and the fourth port 203 of the voltage detection circuit 100 works as voltage input ends and the voltage of the second port 201 is less than the voltage of the fourth port 203, the first step-down sub-circuit 11 steps down the input voltage, and the second step-down sub-circuit 12 is in a short-circuit state, so that the first port 200 outputs a low-level signal compared to the fourth port 203.

According to the voltage detection circuit 100 shown in FIG. 8, any pair of ports in the voltage detection circuit 100 may be used as voltage input ports to perform voltage detection. Compared with voltage detection circuits which only have specific ports working as voltage input ports, the voltage detection circuit 100 provided in the embodiments in conjunction with FIG. 8 is more convenient, which facilitates improving voltage detection efficiency.

Figure 9:
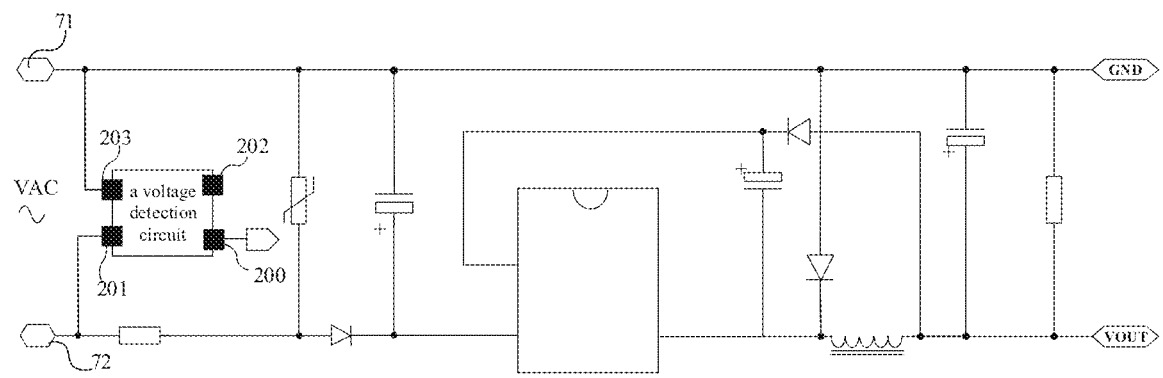
FIG. 9 schematically illustrates a structural diagram of a power supply system according to another embodiment.

In an embodiment, when the voltage detection circuit 100 shown in FIG. 8 is applied to the buck power supply system shown in FIG. 6, as shown in FIG. 9, the first input end 71 of the mains power supply system VAC is connected to the ground and the fourth port 203 of the voltage detection circuit 100. The second input end 72 of the mains power supply system VAC is connected to the second port 201 of the voltage detection circuit 100. The first port 200 of the voltage detection circuit 100 outputs a voltage detection signal.

Figure 10:
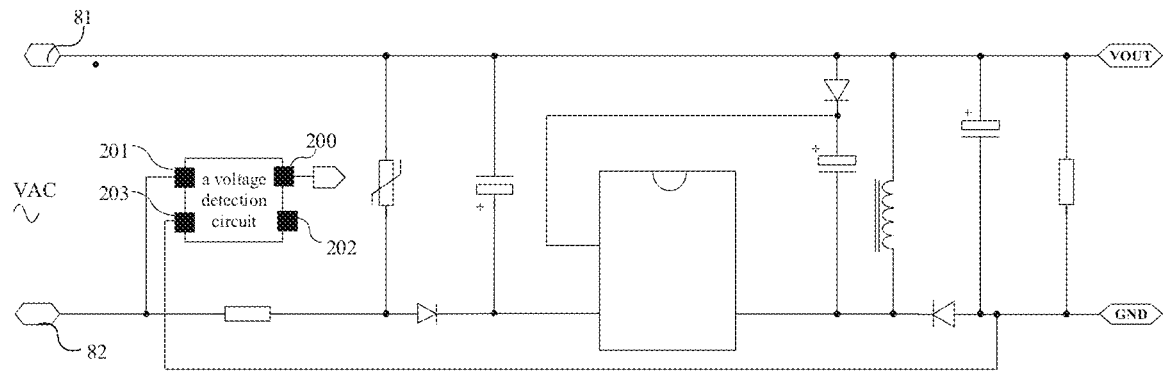
FIG. 10 schematically illustrates a structural diagram of a power supply system according to another embodiment.

In an embodiment, when the voltage detection circuit 100 shown in FIG. 8 is applied to the buck-boost power supply system shown in FIG. 7, as shown in FIG. 10, the first input end 81 of the mains power supply system VAC is connected to an output end VOUT of the buck-boost power supply system. The second input end 82 is connected to the second port 201 of the voltage detection circuit 100. The third port 203 is connected to the ground. The first port 200 of the voltage detection circuit 100 outputs a voltage detection signal.

Those skilled in the art can understand that the power supply systems shown in FIGS. 6, 7, 9 and 10 are presented by way of example only, and not limitation. Those skilled in the art can modify and vary the embodiments without departing from the spirit and scope of the present disclosure.

In an embodiment, a chip in provided, on which the voltage detection circuit 100 described above in the embodiments is integrated. The voltage detection circuit 100 has a smaller number of components and a simple structure, which facilitates to be integrated on a chip.

In summary, according to the embodiments, the voltage detection circuit includes fewer components. For example, the voltage detection circuit in FIG. 2 uses only three components to achieve voltage tracking and detection, which has a simple structure and is easier to be integrated on a chip. In addition, current-limiting components may also be configured as needed, which facilitates to reduce power consumption of the power supply system.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A voltage detection circuit, comprising: a first step-down sub-circuit, a second step-down sub-circuit and a first voltage-stabilizing sub-circuit;
    wherein one end of the first step-down sub-circuit is connected to one end of the second step-down sub-circuit, and the first step-down sub-circuit and the second step-down sub-circuit are connected in series; another end of the first step-down sub-circuit is connected to a first port of the voltage detection circuit; and another end of the second step-down sub-circuit is connected to a second port of the voltage detection circuit;
    wherein the first voltage-stabilizing sub-circuit has one end connected to a third port of the voltage detection circuit and has another end connected to the second port of the voltage detection circuit, where the first voltage-stabilizing sub-circuit is adapted to be turned on when a voltage of the third port is higher than a voltage of the second port and to be stabilized when the voltage of the third port is lower than the voltage of the second port; and
    wherein when the first step-down sub-circuit steps down an input voltage, the second step-down sub-circuit is in a short-circuit state; and when the second step-down sub-circuit steps down the input voltage, the first step-down sub-circuit is in a short-circuit state.

2. The voltage detection circuit according to claim 1, wherein the first step-down sub-circuit comprises a first junction field effect transistor (JFET), which has a drain connected to the first port, a source connected to the second step-down sub-circuit, and a gate connected to the source of the first JFET.

3. The voltage detection circuit according to claim 2, wherein the first step-down sub-circuit further comprises a first current limiting component, which has one end connected to the source of the first JFET and another end connected to the second step-down sub-circuit and the gate of the first JFET.

4. The voltage detection circuit according to claim 3, wherein the first current limiting component comprises a first resistor.

5. The voltage detection circuit according to claim 3, wherein the first current limiting component comprises a first resistor, a first diode and a first N-Metal-Oxide-Semiconductor (NMOS) transistor, wherein the first resistor has one end connected to the source of the first JFET and a drain of the first NMOS transistor, and another end connected to a gate of the first NMOS transistor; the first NMOS transistor is connected to the second step-down sub-circuit; and the first diode has an anode connected to the gate of the first JFET and a source of the first NMOS transistor and a cathode connected to the gate of the first NMOS transistor.

6. The voltage detection circuit according to claim 1, wherein the second step-down sub-circuit comprises: a second JFET, which has a source connected to the first step-down sub-circuit, a gate connected to the source of the second JFET, and a drain connected to the second port.

7. The voltage detection circuit according to claim 6, wherein the second step-down sub-circuit further comprises: a second current limiting component, which has one end connected to the source of the second JFET and another end connected to the first step-down sub-circuit and the gate of the second JFET.

8. The voltage detection circuit according to claim 7, wherein the second current limiting component comprises a second resistor.

9. The voltage detection circuit according to claim 7, wherein the second current limiting component comprises: a second resistor, a second diode and a second NMOS tube, wherein the second resistor has one end connected to the source of the second JFET and the drain of the second NMOS transistor, and another end connected to the gate of the second NMOS transistor; the second NMOS transistor is connected to the first step-down sub-circuit; the second diode has an anode connected to the gate of the second JFET and the source of the second NMOS transistor, and a cathode connected to the gate of the second NMOS transistor.

10. The voltage detection circuit according to claim 1, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port.

11. The voltage detection circuit according to claim 2, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

12. The voltage detection circuit according to claim 3, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

13. The voltage detection circuit according to claim 4, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

14. The voltage detection circuit according to claim 5, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

15. The voltage detection circuit according to claim 6, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

16. The voltage detection circuit according to claim 7, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

17. The voltage detection circuit according to claim 8, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

18. The voltage detection circuit according to claim 9, further comprising: a second voltage-stabilizing sub-circuit, where the second voltage-stabilizing sub-circuit has one end connected to a fourth port of the voltage detection circuit, has another end connected to the first port, and is adapted to be turned on when a voltage of the fourth port is higher than a voltage of the first port; and wherein the first voltage-stabilizing sub-circuit comprises a third diode and the second voltage-stabilizing sub-circuit comprises a fourth diode.

19. A power supply system, comprising a voltage detection circuit according to claim 1.

20. A chip, comprising a voltage detection circuit according to claim 1 integrated therein.

\* \* \* \* \*